(12) United States Patent
Rebstock

(10) Patent No.: US 10,930,536 B2
(45) Date of Patent: Feb. 23, 2021

(54) WORKPIECE STOCKER WITH CIRCULAR CONFIGURATION

(71) Applicant: Brooks Automation (Germany) GmbH, Jena (DE)

(72) Inventor: Lutz Rebstock, Radolfzell (DE)

(73) Assignee: Brooks Automation (Germany) GmbH

( * ) Notice: Subject to any disclaimer, the term of this patent is extended or adjusted under 35 U.S.C. 154(b) by 139 days.

(21) Appl. No.: 15/954,230

(22) Filed: Apr. 16, 2018

(65) Prior Publication Data
US 2019/0019709 A1 Jan. 17, 2019

Related U.S. Application Data

(63) Continuation of application No. 13/007,580, filed on Jan. 14, 2011, now Pat. No. 9,947,565, which is a continuation of application No. 11/811,372, filed on Jun. 9, 2007, now Pat. No. 7,896,602.

(60) Provisional application No. 60/859,202, filed on Nov. 15, 2006.

(30) Foreign Application Priority Data

Jun. 9, 2006 (DE) ..................... 10 2006 028 057.1

(51) Int. Cl.
*H01L 21/677* (2006.01)
(52) U.S. Cl.
CPC ..... *H01L 21/67769* (2013.01); *Y10S 414/137* (2013.01); *Y10S 414/141* (2013.01)

(58) Field of Classification Search
CPC ................... H01L 21/67718; H01L 21/67766
See application file for complete search history.

(56) References Cited

U.S. PATENT DOCUMENTS

| 4,473,883 A | 9/1984 | Yoshida et al. |
| 4,573,851 A | 3/1986 | Butler |
| 4,653,650 A | 3/1987 | Schulke |

(Continued)

FOREIGN PATENT DOCUMENTS

| CN | 101617397 | 12/2009 |
| DE | 10329868 | 1/2005 |

(Continued)

OTHER PUBLICATIONS

International Search Report, International Application No. PCT/IB2007/054656, dated Apr. 28, 2007.

*Primary Examiner* — Jonathan Snelting
(74) *Attorney, Agent, or Firm* — Perman & Green, LLP; Colin C. Durham

(57) ABSTRACT

An improved stocker configuration for storing workpieces in a fabrication facility is disclosed, employing workpiece compartments arranged stationarily around a robot handling assembly. The robot handler can be designed with three degrees of freedom, to improve speed, throughput and minimum particle generation. In addition, the stocker storage area is stationary with the movable components are the robot assembly, thus further contributing to the cleanliness of the storage stocker. The stocker configuration can be open storage area for fast access, space saving and ease of clean air purging. The stocker configuration can provide highly dense workpiece storage, utilizing a circumferential edge gripper robot handling assembly.

20 Claims, 14 Drawing Sheets

(56) References Cited

U.S. PATENT DOCUMENTS

| | | | |
|---|---|---|---|
| 4,867,629 | A | 9/1989 | Iwasawa et al. |
| 4,886,412 | A | 12/1989 | Wooding et al. |
| 4,923,352 | A | 5/1990 | Tamura et al. |
| 4,986,715 | A | 1/1991 | Asakawa |
| 5,022,695 | A | 6/1991 | Ayers |
| 5,059,079 | A | 10/1991 | Foulke et al. |
| 5,090,972 | A | 2/1992 | Eller et al. |
| 5,096,477 | A | 3/1992 | Shinoda et al. |
| 5,344,365 | A | 9/1994 | Scott et al. |
| 5,363,867 | A | 11/1994 | Kawano et al. |
| 5,525,106 | A | 6/1996 | Iizuka et al. |
| 6,089,377 | A | 7/2000 | Shimizu |
| 6,089,811 | A | 7/2000 | Watanabe et al. |
| 6,099,599 | A | 8/2000 | Wu |
| 6,123,120 | A | 9/2000 | Yotsumoto et al. |
| 6,142,722 | A | 11/2000 | Genov et al. |
| 6,251,155 | B1 * | 6/2001 | Fukushima ............ B01D 46/00 454/187 |
| 6,332,744 | B1 * | 12/2001 | Fukushima ............ B65G 1/045 414/283 |
| 6,398,476 | B1 | 6/2002 | Ando |
| 6,516,243 | B2 | 2/2003 | Chang et al. |
| 6,578,893 | B2 | 6/2003 | Soucy et al. |
| 6,690,993 | B2 | 2/2004 | Foulke et al. |
| 6,712,577 | B2 | 3/2004 | Davis et al. |
| 6,848,876 | B2 | 2/2005 | Babbs et al. |
| 6,885,911 | B1 | 4/2005 | Smith |
| 6,893,805 | B2 * | 5/2005 | Iseki ................. H01L 21/31058 118/715 |
| 7,073,173 | B1 | 7/2006 | Willman |
| 7,198,447 | B2 | 4/2007 | Morimitsu et al. |
| 7,731,470 | B2 | 6/2010 | Yamamoto |
| 7,896,602 | B2 | 3/2011 | Rebstock |
| 7,993,093 | B2 | 8/2011 | Mimken |
| 8,180,893 | B1 | 5/2012 | Spertus |
| 2002/0009359 | A1 | 1/2002 | Sundar |
| 2002/0048506 | A1 | 4/2002 | Babbs et al. |
| 2002/0094257 | A1 | 7/2002 | Babbs et al. |
| 2003/0009904 | A1 | 1/2003 | Tokunaga |
| 2003/0017034 | A1 | 1/2003 | Davis et al. |
| 2003/0077150 | A1 | 4/2003 | Matsuda et al. |
| 2003/0091410 | A1 | 5/2003 | Larson et al. |
| 2004/0000129 | A1 | 1/2004 | Ishihara et al. |
| 2004/0026694 | A1 | 2/2004 | Blattner et al. |
| 2004/0037675 | A1 | 2/2004 | Zinger et al. |
| 2004/0086368 | A1 | 5/2004 | Downs et al. |
| 2004/0105737 | A1 | 6/2004 | Ozawa et al. |
| 2004/0191028 | A1 | 9/2004 | Tamai |
| 2005/0081020 | A1 | 4/2005 | Volp |
| 2005/0095098 | A1 | 5/2005 | Miyajima et al. |
| 2005/0100435 | A1 | 5/2005 | Dickinson |
| 2006/0263176 | A1 | 11/2006 | Moran |
| 2007/0006306 | A1 | 1/2007 | Seifert et al. |
| 2007/0217436 | A1 | 9/2007 | Markley et al. |
| 2008/0046108 | A1 | 2/2008 | Rebstock |
| 2008/0112787 | A1 | 5/2008 | Rebstock |
| 2009/0028669 | A1 | 1/2009 | Rebstock |
| 2009/0094439 | A1 | 4/2009 | Mansell et al. |
| 2011/0236176 | A1 | 9/2011 | Rebstock |
| 2013/0276096 | A1 | 10/2013 | Symes et al. |
| 2014/0294544 | A1 | 10/2014 | Rebstock |
| 2014/0294546 | A1 | 10/2014 | Rebstock |

FOREIGN PATENT DOCUMENTS

| | | |
|---|---|---|
| DE | 10350517 | 6/2005 |
| DE | 102006028057 | 4/2007 |
| EP | 0552756 | 7/1993 |
| EP | 1037264 | 9/2000 |
| EP | 1197990 | 4/2002 |
| EP | 1202325 | 5/2002 |
| EP | 2092556 | 8/2009 |
| JP | 58155736 | 6/1983 |
| JP | 63174333 | 7/1988 |
| JP | 0468541 | 6/1992 |
| JP | 0637168 | 2/1994 |
| JP | 06345206 | 12/1994 |
| JP | 0858916 | 3/1996 |
| JP | 0858930 | 3/1996 |
| JP | 08139154 | 5/1996 |
| JP | 2000056200 | 2/2000 |
| JP | 2000100920 | 4/2000 |
| JP | 2001179579 | 7/2001 |
| JP | 2002541678 | 12/2002 |
| JP | 2003182815 | 7/2003 |
| JP | 2005500522 | 1/2005 |
| JP | 2005203498 | 7/2005 |
| JP | 2010509785 | 3/2010 |
| KR | 20090098827 | 9/2009 |
| KR | 20140023449 | 2/2014 |
| WO | 0062332 | 10/2000 |
| WO | 0205320 | 1/2002 |
| WO | 2006031975 | 3/2006 |
| WO | 2008059457 | 5/2008 |

* cited by examiner

WORKPIECE STOCKER WITH CIRCULAR CONFIGURATION

This application is a continuation of application Ser. No. 13/007,580, filed on Jan. 14, 2011, which is a continuation of application Ser. No. 11/811,372 (now U.S. Pat. No. 7,896,602) filed on Jun. 9, 2007, which claims priority of and benefit from U.S. provisional paten application No. 60/859,202, filed on Nov. 15, 2006, entitles "Workpiece stocker with circular configuration"; and from German patent application 10 2006 028 057.1, filed on Jun. 9, 2006 the disclosures of which are incorporated herein by reference in their entireties.

FIELD OF THE INVENTION

The present invention relates to apparatuses and methods to store and transfer objects, and more particularly to workpiece stocker configurations such as stocker for semiconductor wafers, reticles or carrier boxes.

BACKGROUND

Stockers generally are installed within a semiconductor facility for temporarily storing workpieces, such as wafers, flat panel displays, LCD, photolithography reticles, or masks. In the process of manufacturing semiconductor devices, LCD panels, and others, there are hundreds of processing equipments and thus hundreds of manufacturing steps. It is very difficult for the flow of the wafers, flat panels, or LCDs (hereafter workpiece) to be uniform from step to step, from tool to tool. Despite the best planners, there is always the unexpected scenario, such as a tool down, an emergency lot coming through, a periodic maintenance lasting longer than planned, thus there are various accumulations of the workpieces at certain steps for certain tools. The accumulated workpieces will need to be stored in a storage stocker, waiting to be processed.

Further, photolithography process is a critical process in the semiconductor fabrication facility, involving a large number of photolithography masks or reticles (hereinafter reticle). The reticles thus are typically stored in a storage stocker, and being retrieved when needed into the lithography exposure equipment.

The storage of workpieces and reticles (hereafter articles) is much more complicated due to the requirement of cleanliness. Damages to the articles can be physical damages in the form of particles, or chemical damages, in the form of interactions. With the critical dimension of the semiconductor device processing surpassing 0.1 micron, particles of 0.1 micron sizes, and reactive species will need to be prevented from approaching the articles. The storage areas typically would need to be even cleaner than the processing facility, to ensure less cleaning between processing.

Thus the stocker storage areas is typically designed to be sealed off from the outside environment, preferably with constant purging, and even with inert gas flow to prevent possible chemical reactions. Access to the storage areas is load-locked, to ensure isolation between the clean storage environment and the outside environment.

SUMMARY

The present invention discloses an improved stocker configuration for storing workpieces in a fabrication facility, especially a wafer stocker or a reticle stocker for semiconductor processing. In an exemplary embodiment, the workpieces are stored stationary around a robot handling assembly, preferably substantially circular. In this configuration, the robot handler can be designed with three degrees of freedom, e.g. radial, rotational and vertical movements, thus can have improved speed and throughput. Three degree of freedom robots are well established with minimum particle generation, thus this configuration can provide cleanliness for workpiece storage. In addition, the stocker storage area is stationary with the movable components are the robot assembly, thus further contributing to the cleanliness of the storage stocker.

In an embodiment, the stocker configuration provides an open storage area with the workpieces stored bare for easy access. The storing of bare workpieces provides fast access, space saving and ease of clean air purging. The storage area can be configured with a plurality of open compartments, arranging surrounding a robot handling assembly, also in the vertical direction.

In an embodiment, the stocker configuration provides the storage of the workpieces in a highly dense configuration, in either vertical or horizontal positions. The stocker provides a circumferential edge gripper robot handling assembly, approaching and picking up the workpieces from the circumferential edges, thus allowing the dense workpiece storage configuration.

The storage area can include clean air delivery system flowing inward toward the center, such as the robot handling system. This inward flow configuration reduces particle contamination since there is no particle generation upstream of the clean air flow. Further, the storage area can be partitioned into a plurality of sections based on cleanliness, for example, a top section for ultra clean storage, a middle section for normal clean storage, and a bottom section for dirty storage. The flow configuration can be designed for minimizing cross contamination between these sections.

BRIEF DESCRIPTIONS OF THE DRAWINGS

DETAIL DESCRIPTIONS

Figure 1:
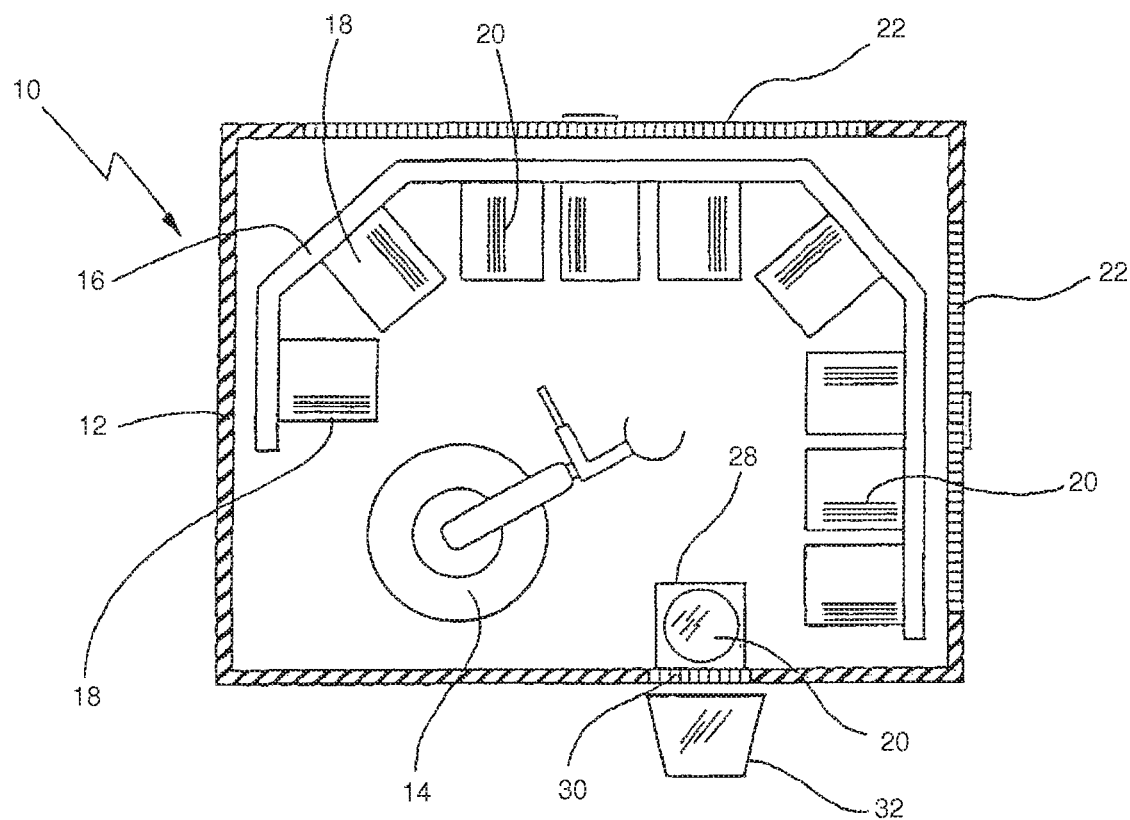
FIG. 1 shows an exemplary embodiment of the stocker according to the present invention.

The stocker according to an exemplary embodiment of the present invention is designed for storing contamination-sensitive wafer shape articles such as semiconductor wafers, and reticles. The stocker designed is particularly configured for space-saving storage and flexible handling. The stocker, in particular, is well suitable for storing a large number of 300 mm or larger wafer on a small storage space under clean conditions.

In an embodiment, the stocker provides that the articles, such as semiconductor wafers, can be stored openly in the clean storage area, together with the robot handling assembly. The robot handling unit thus can access very fast the individual articles and to pick up and place them in carrier boxes. The open storage concept can provide high density with small footprint storage.

The open storage can be partitioned into compartments to reduce the risk of cross contamination. The compartments can include storage containers, fastened to carrier racks. The stationary of the carrier racks, the storage containers, the compartments and the articles prevent particles generated from motions, thus substantially reducing the risk of particles generated by abrasion, movement and cross contamination air flow.

The storage containers are preferably shaped as a open, box-like container, where the robot handling unit can be adapted optimally to inserting and taking articles out of the storage containers. In a preferred embodiment, the containers are designed for highly dense storage of articles, for example semiconductor wafer with a pitch distance of less than 5 mm, preferably about 2.5 mm or less. The storage containers are arranged in a shelving configuration surrounding the robot handling unit, and preferably approximately circular. The storage containers can be arranged in a x-y array, with the shelves openings facing a robotic mechanism for transferring the articles. The stationary stocker comprises a plurality of vertically and horizontally spaced shelves each for storing a plurality of articles. The shelves can also designed for storing a plurality of containers where the articles are stored within.

This configuration can provide space-saving arrangement and at the same time high storage capacity. In addition a very fast accessing of stored articles can be possible in this configuration. The particularly preferred configuration of circular arrangement of the storage containers is well suited with a three degree of freedom robot such as a SCARA robot. The robots includes articulated arms, mobile in a horizontal plane with rotational and radially to a center point. The robot can also be a six axis robot.

Robot assemblies are an important component in automation, especially in manufacturing facilities and manufacturing equipments. For example, in the semiconductor industry, robot arms are used to handle semiconductor wafers, flat panel display, LCD, reticles, masks, or carrier boxes.

In the semiconductor fabrication facility, robot can be used to transport workpieces, typically stored in carrier boxes, from one location to another location, from one equipment to another equipment. In a process system, a robot is typically used to remove the workpieces from the carrier boxes, and then loaded into a loadlock. Another robot can be used to move the workpiece from the loadlock into a processing chamber, and from one processing chamber to another processing chamber. Thus within a processing system, there might be a plurality of robots, each one is designed for a particular task. The processing system could be a deposition system, an etch system, a lithography system, a metrology system, an inspection system, an implantation system, a treatment system, or any workpiece processing system.

Generally speaking, robot handling assembly are different for vacuum system and atmospheric system. The stocker, designed for storing the workpieces until needed, is typically an atmospheric system where a robot is typically used to remove the workpieces from the carrier boxes, and then loaded into a loadlock. Another robot can be used to move the workpiece from the loadlock into a storage chamber, where the workpieces are stored without the original carrier boxes. For box stocker system, the workpieces are stored together with the carrier boxes, without the need for removing them out of the carrier boxes.

The robot mechanism can comprises articulate arm joints to move an article or a container into and out of the stationary stocker. Further, the robot arm assembly comprises a flexible multiple-link mechanism, designed to reach the shelves of the stocker. The arm assembly can have independent radial and rotational movements to reach the arranged spaces of the stocker.

The stocker of the present invention provides storage containers forming approximately a substantially circular cabinet around a robot handling device. The robot assembly is preferably stationary, with articulate arm joints reaching the inner side of the stationary stocker to transfer articles.

The surrounding, e.g. circular, arrangement of the stocker allows the use of vacuum robot, thus the robot assembly is less likely to generate particles within the stocker storage area. The stocker further comprises loadlock station to isolate the outside environment. This configuration afforts the articles stored in the radial path of a robot, thus providing fast picking up and placing articles. Plus, the control of the robot handling assembly is greatly simplified and programmed.

The stored articles can also be arranged in a circular configuration, thus providing a smaller pitch in the inner surface than the outer pitch. The articles then are position in V-shaped in the storage container relative to each other, thus can be effectively cleaned with a clean gas flow from the outside to the inside.

The robot handling unit includes vertical movement to access the vertical storage containers. The stocker can also include a second handling unit for transferring the articles into or from the containers. The stocker can include backside doors for accessing the back of the article containers. The back doors allow access to the articles in emergency events, such as a system crash. The stocker can include a blower for producing a continuous clean gas flow toward the containers, and preferably blowing contamination efficiently downward.

Figure 2:
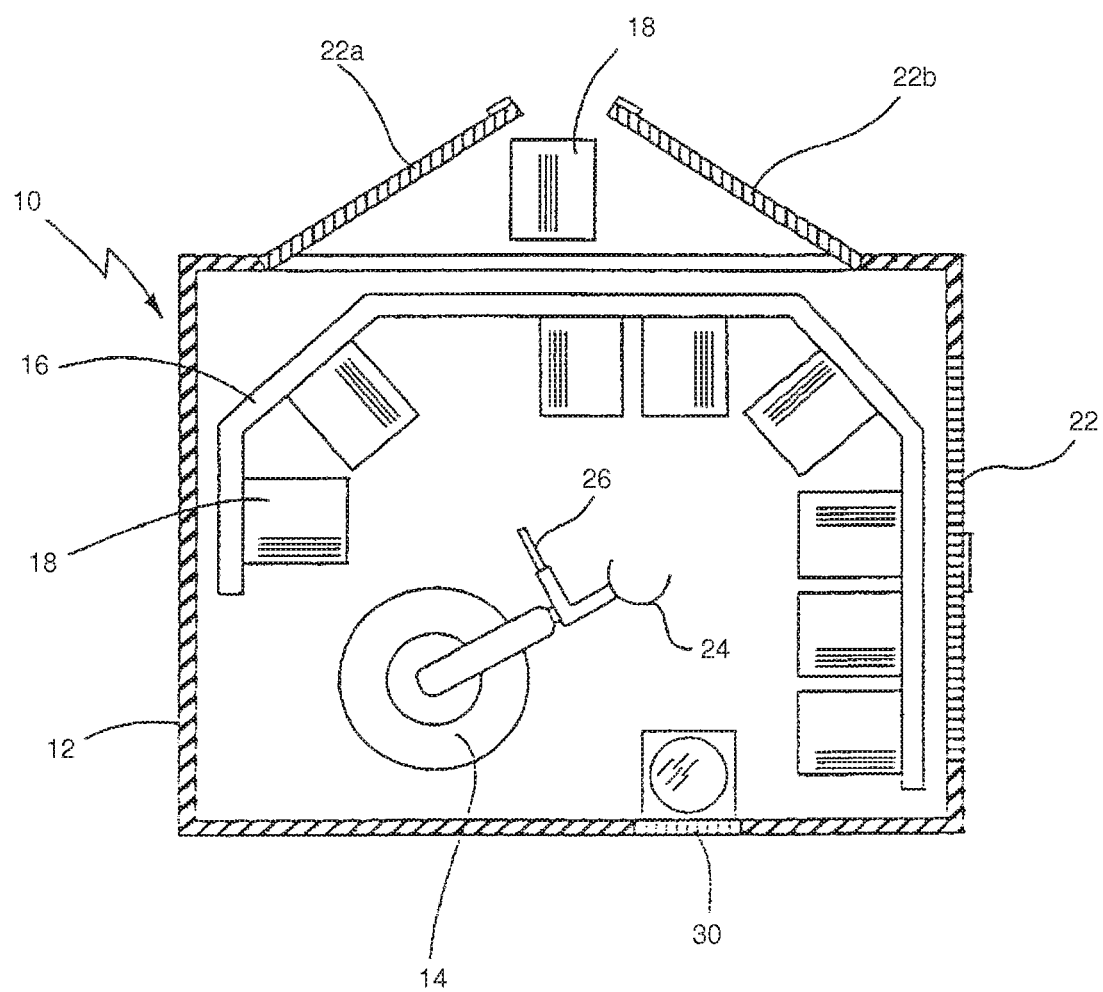
FIG. 2 shows an exemplary stocker with opened door for the manual withdrawal of a container.

An exemplary stocker 10 is shown in FIGS. 1 and 2. The stocker 10 includes a housing 12, containing a robot handling unit 14 and a carrier rack 16 to support a plurality of article containers 18. The housing 12 surrounds the robot handling unit 14, the carrier rack 16 and the containers 18 to form complete enclosure for a clean environment. The top of the housing can be provided with blower and filters (not shown) to produce within the housing 12 a flow of clean air from the top to the bottom.

Each container 18 is designed to store a plurality of contamination-sensitive articles. In a preferred embodiment, the articles are semiconductor wafers, which can be stored vertically in the container 18. In an exemplary embodiment, each container can hold 100 wafers of 300 mm. The distance between the stored wafers can be a little as 2.5 mm.

The robot handling unit 14 can be a radial, rotational and vertical robot, or can be a 6-axis robot, located in a corner of the housing 12. The carrier rack 16 with the containers 18 are forming a C-shape surrounding the robot handling unit 14. In FIG. 2, two doors 22 are located in the side panels of the housing 12 to provide manual access to the containers 18 from the rear of the housing. A container 18' is shown in FIG. 2 to be removed from the carrier rack by the doors 22 comprising door panels 22a and 22b. A mobile clean area and an appropriate enclosure (not shown) can be provided before the withdrawal of the container 18' to prevent exposure to the external contaminants.

The stocker 10 can further comprise a pre-aligner 28 for aligning a wafer 20. The wafer 20 can be taken in and out of the pre-aligner 28 by a door 30, connected to a FOUP 32.

Figure 3:
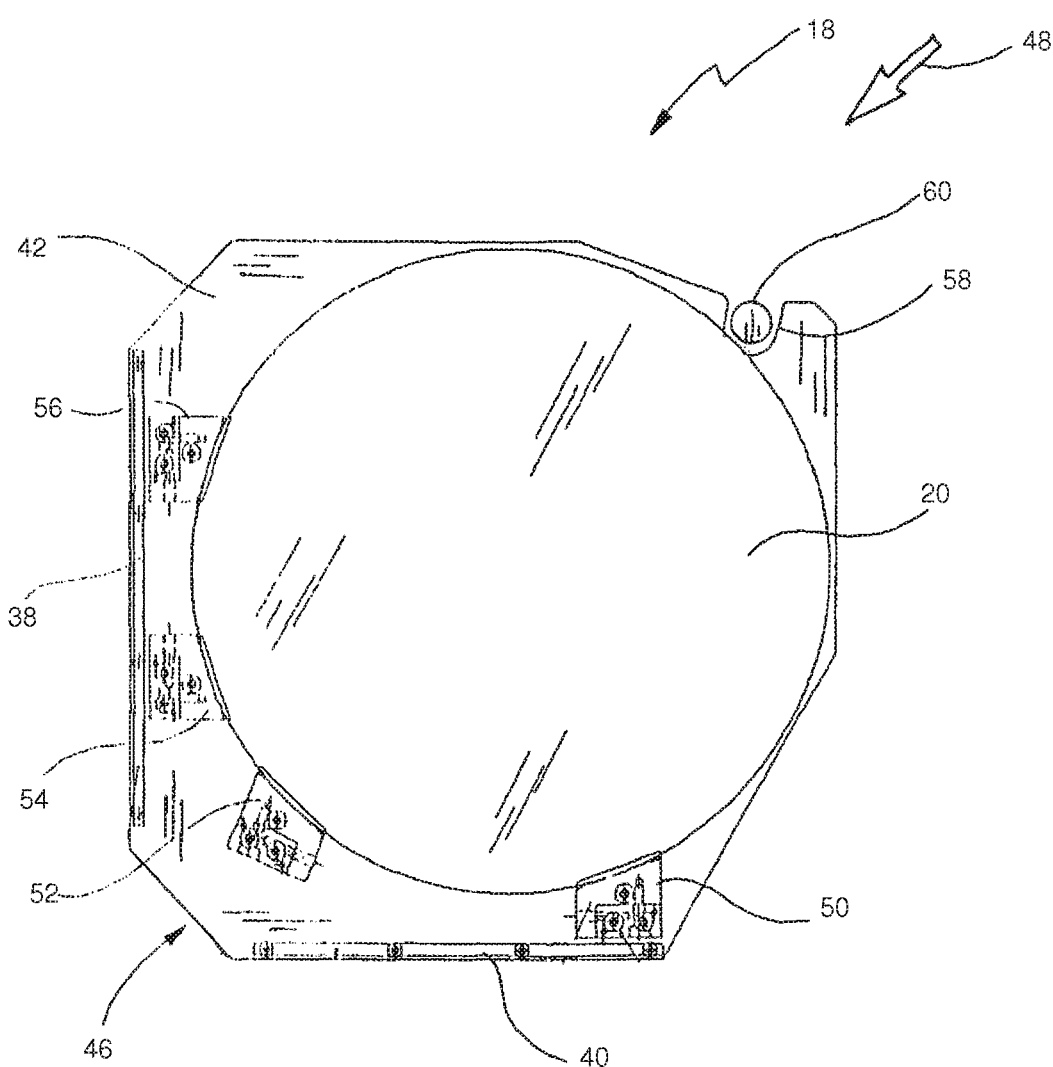
FIG. 3 shows a cross section of a container for a stocker (line III-III in FIG. 4).
Figure 4:
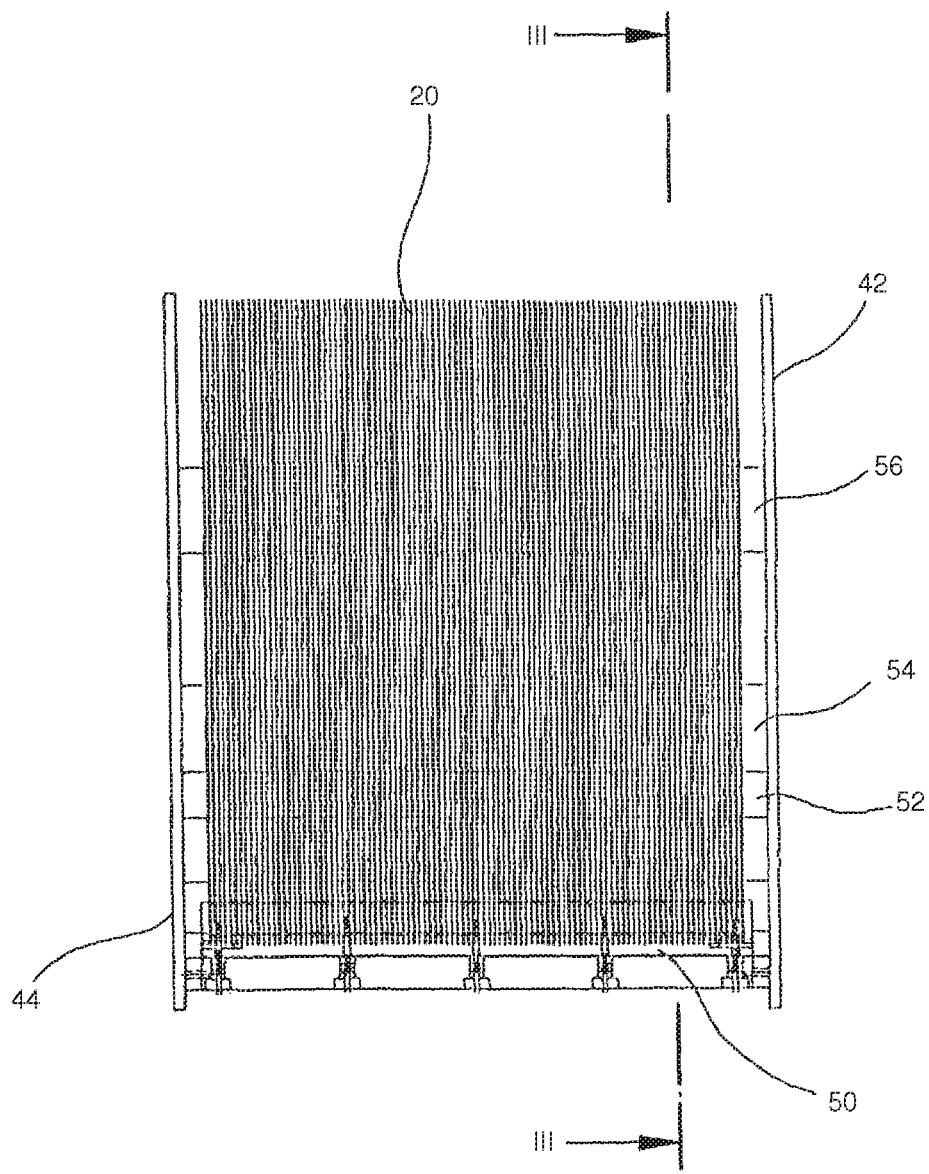
FIG. 4 shows another view of a container.

FIGS. 3 and 4 show an exemplary embodiment of a container 18, which includes a rear wall 38, a bottom wall 40 and two side panels 42, 44. The rear wall 38 and the bottom wall 40 preferably provides an opening 46 for releasing clean air flow diagonally across the wafer 20. The air flow 48 between the individual wafers 20 passes through and ensures that any existing particles and foreign matter are removed diagonally downward from the container 18.

Within the container 18 four comblike components with splits 50, 52, 54, 56 are arranged. The split 50-56 are arranged to hold a wafer by its down and back side to permit the removal of the wafer with the robot handling unit 14.

At the upper corner area, there exists a recess 58 to insert a retainer 60. The retainer 60 is designed to hold the wafers in place during movement of the container 18. Each container 18 may have a handle (not shown), which is connected with the retainer 60, so that a withdrawal of the container 18 is only possible if the retainer 60 is inserted in the recess 58.

Figure 5:
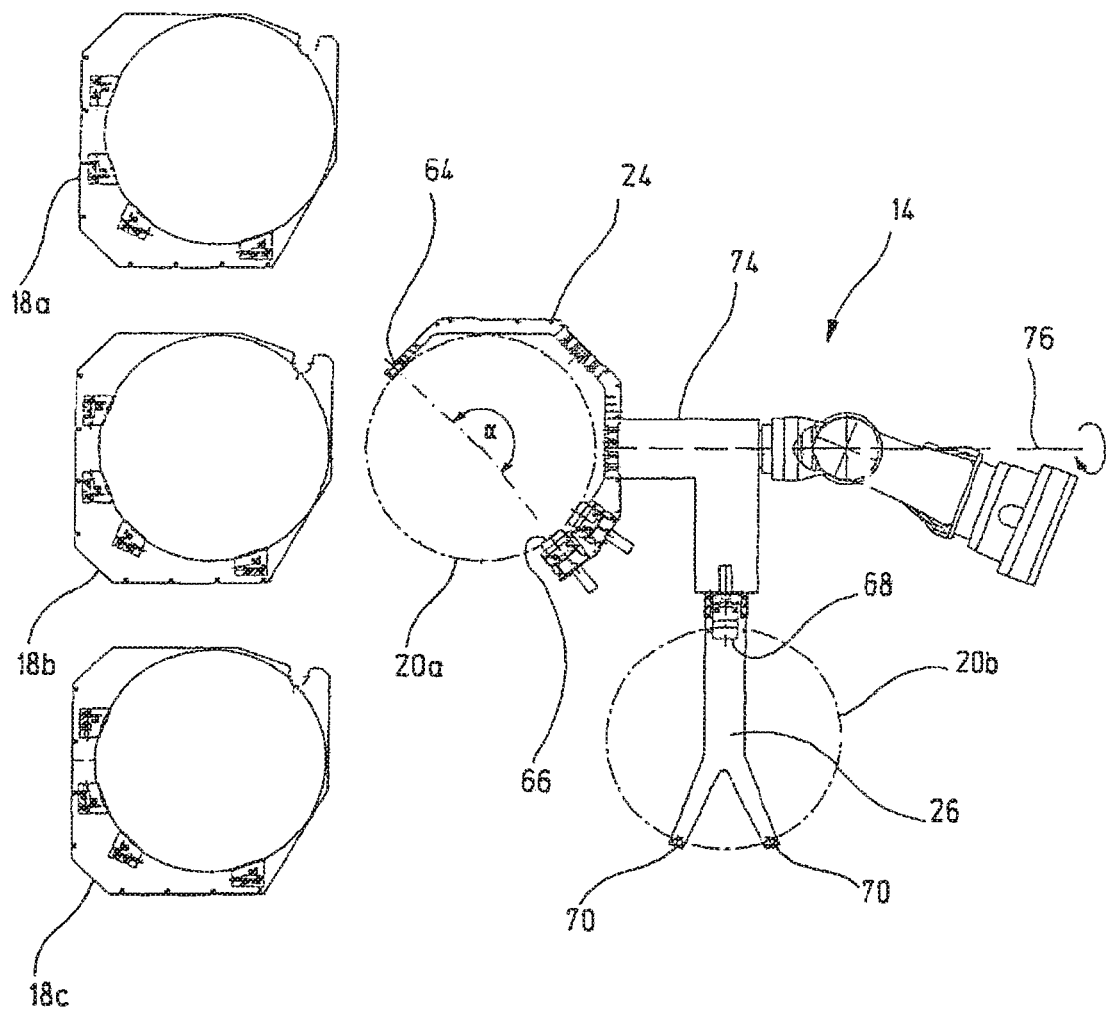
FIG. 5 shows a top view of a robot handling assembly unit.
Figure 6:
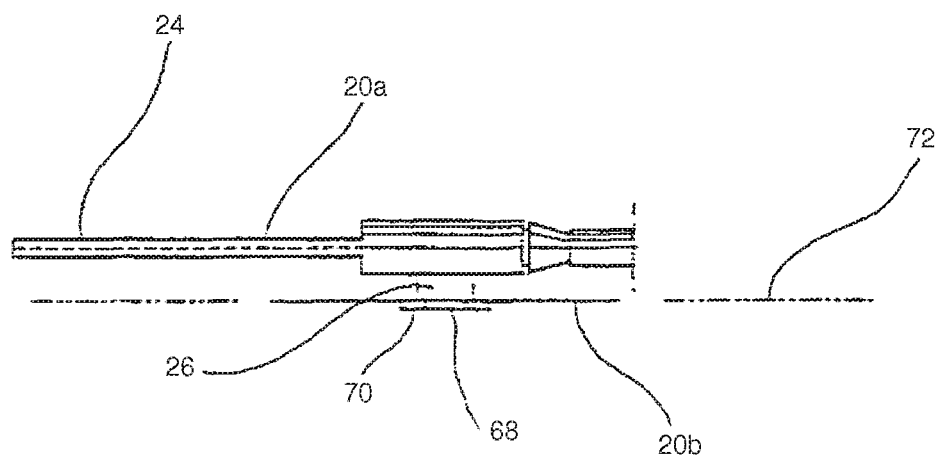
FIG. 6 shows a side view of a robot handling unit.

FIGS. 5 and 6 shows an exemplary robot handling unit according to the present invention. The integrated grip arm 14 possesses a first gripper arm 24 and a second gripper arm 26. The first gripper arm 24 is designed as a grip arm, where a wafer 20a can be seized at the edges in a vertical position. The grip arm 24 surrounds the wafer 20a at its outer circumference in an exemplary C-shaped. Two grip elements 64 and 66 are arranged at the free ends of the grip arm 24. The grip arm 24 surrounds the wafer 20a along a circular arc "alpha" of more than 180°. The grip elements 64, 66 can hold the wafer 20a therefore without firm wedging and essentially alone due to gravity. For the pick up and placement of a wafer 20a in a carrier box 18, the grip elements 64, 66 can be opened. In this figure, only the grip element 66 is mobile.

The second gripper arm 26 comprises a Y-shape arm with grip elements 68, 70 at the ends. The gripper arm 26 is holding a wafer in different plane 72 than the gripper arm 24. A wafer 20b is held by the grip elements 68, 70 in the plane 72. The gripper arm 26 has a free end, thus can enter a FOUP to pick up or placing a wafer.

The grippers 24 and 26 are arranged at the free ends of an L-shaped arm segment 74 of an integrated grip arm 14. The arm segment 74 can be swiveling around an axle 76, which lies coaxially to a leg of the arm segment 74, where the gripper 24 is located. This arrangement makes it possible to take and by a 90° rotation around the axle 76, bringing a wafer 20a into a horizontal position out of a vertical position from the carrier box 18. The integrated grip arm can then transfer the wafer to a horizontal station, for example, the pre-aligner 28 in FIG. 1 or 94 in FIG. 8. The integrated grip arm then switches gripper, and the gripper 26 can pick up the wafer and transfer to a FOUP. Wafers from the FOUP can be brought into the carrier box 18 by reverse operations. The integrated grip arm thus can provide movement of the wafers from a FOUP to the storage area with the grippers 24 and 26.

The stocker 10 can provide random access to the stored wafer, thus can eliminate the need for a sorter. In particular, the robot handling unit 14 is capable of selecting wafers 20 from arbitrary containers 18 into a FOUP 32. The stocker 10 thus can be integrated with a FOUP front end loader. Due to the vertical storage and the associated high density storage arrangement of the wafers, the stocker can achieve high storage capacity with small footprint. The storage of the individual wafers in open, separate, box shaped container ensures that cross contamination between different wafers 20 is difficult despite the open storage configuration.

Figure 7:
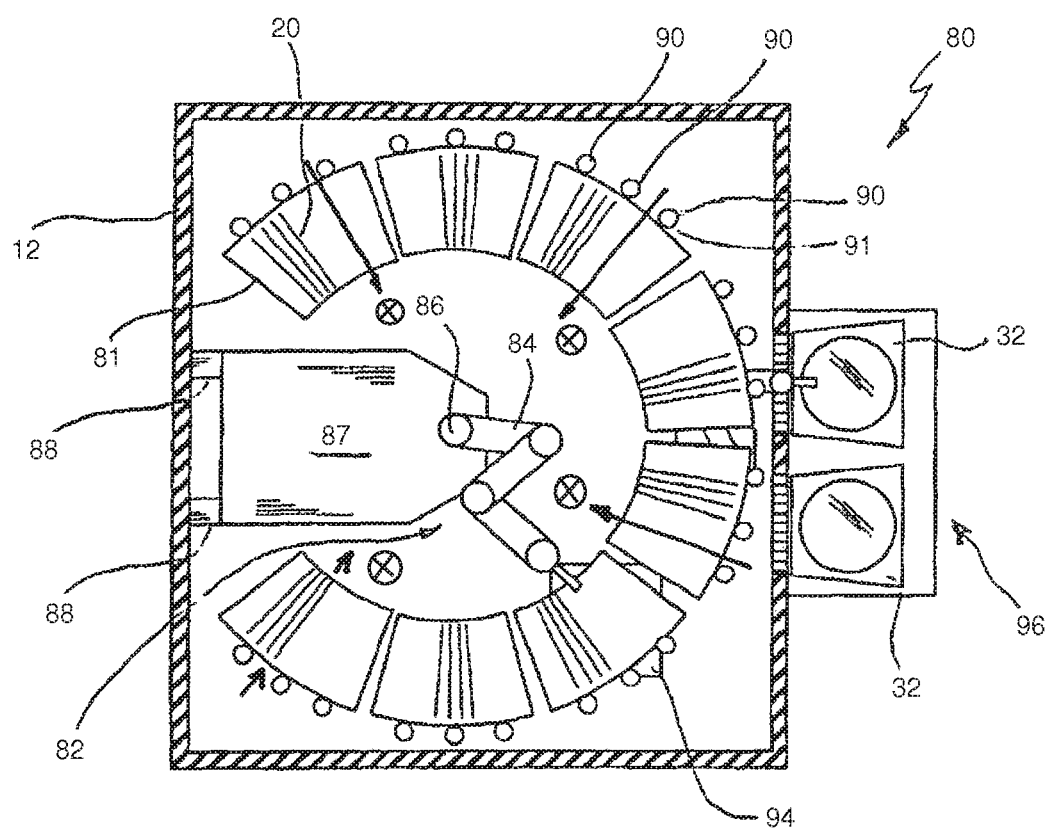
FIG. 7 shows another embodiment of the stocker according to the present invention, top view.
Figure 8:
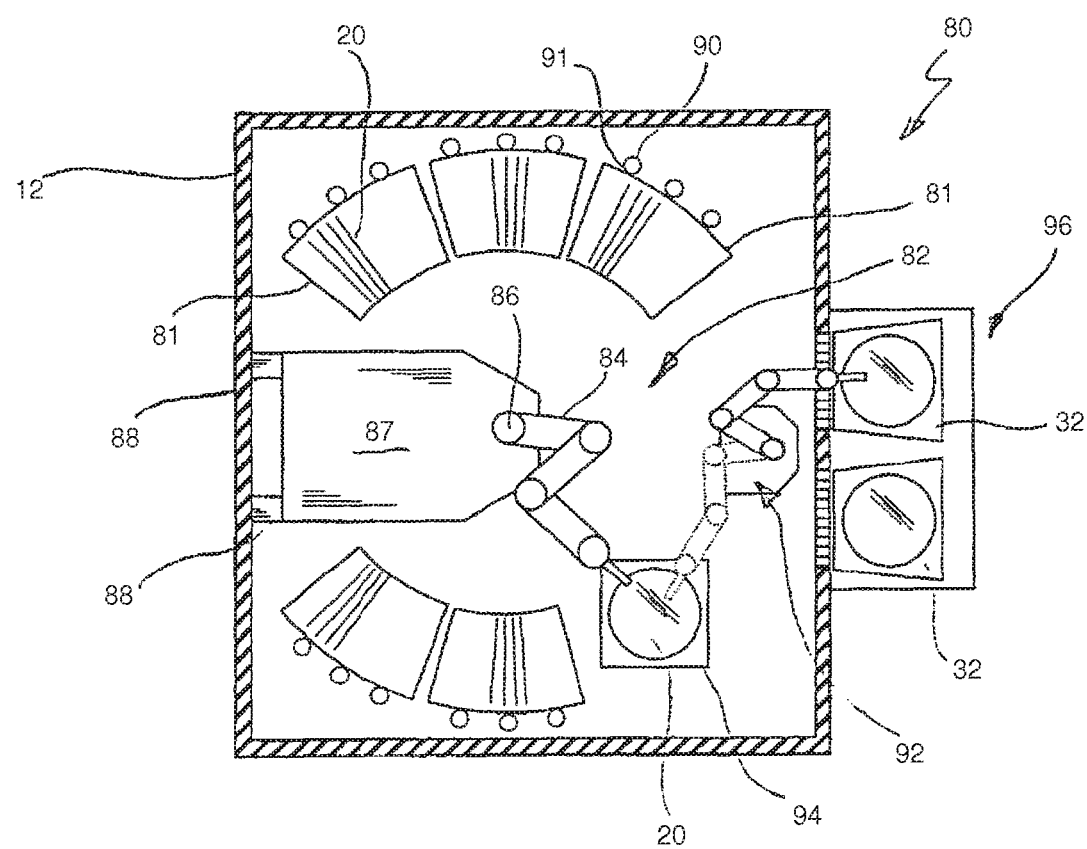
FIG. 8 shows another embodiment of the stocker according to the present invention, top view.

FIGS. 7 and 8 show exemplary embodiments of the present invention stocker 80, comprising a plurality of containers 81 surrounding a robot handling unit 82 in a circle. The handling unit 82 is depicted with a SCARA robot 87 with an articulate arm 84, that can move radially in a horizontal plane parallel to the view level. The articulate arm 84 is swiveling around an center point 86, which defines a circular arrangement of the containers 81. Thus the articulate arm 84 can provide movements within the horizontal plane, radially and rotationally to the center point 86. The articulate arm 84 is arranged pick up and to place articles 20 in radial direction in and out of containers 81.

Figure 9:
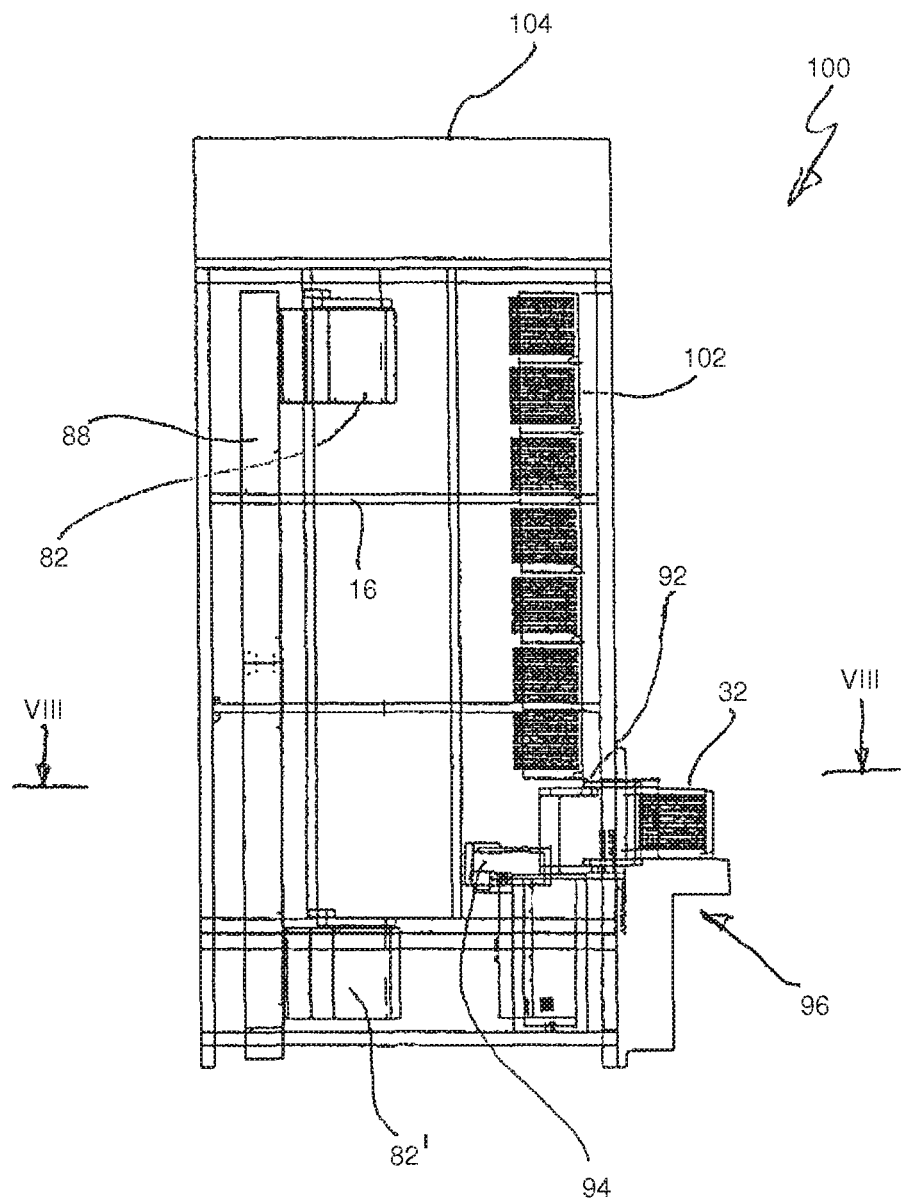
FIG. 9 shows a side view of an exemplary stocker with two robot positions.

FIG. 8 is a plan view on the exemplary stocker 80 along a cutting plane, e.g. the cutting plane VIII-VIII from corresponding FIG. 9. In this plane, some containers 81 are missing from the circular arrangement. In these spaces, a second handling unit 92 and a Prealigner 94 can be provided.

The robot handling unit 82 is designed to transfer a wafer from a container 81 to the Prealigner 94. In addition the robot handling unit 82 can rotate the wafer, taking a vertical stored wafer in the container 81 to a horizontal stored wafer position on the Prealigner 94. The second handling unit 92 can be used to transfer the wafer from the Prealigner 94 to the FOUP 32. It is preferable that the load lock station 96 possesses a hermetic connection to the housing 12, so that the wafer 20 can be transferred into the FOUP 32 contamination-free.

The second handling unit 92 can also be a robot with an articulate arm, radially movable to a center point to move the wafer between the Prealigner and the FOUPs.

The load lock input/output station 96 can include two FOUP 32. This configuration can provide the functionality of a sorter, providing the means to relocate and sort wafers 20 between two FOUPs 32.

The stocker storage system is designed so that the storage area is free of movement components, circuitry, and other contaminant generating parts. Further, the air flow is filtered before entering the storage area, and the storage area is designed to have a laminar air flow on the surfaces of each workpiece, thus ensuring that there is no upstream contamination generation source. The clean air flow is then passing the workpieces toward the robot handling unit, which is located in the center of the storage area, downstream of the clean air flow. Thus the movement of the robot handling unit does not contribute to any particle generation within the clean air flow path over the workpieces. Other components associated with the operation of the stocker system are located external to the storage unit and downstream of the air flow over the workpieces.

To further removing particles from the workpieces, air flow acceleration might be created when the air exits the workpieces. Thus the workpieces can be arranged to form wedge shape storage area with the entrance larger than the exit. When the air flow passes through the workpieces, it accelerates through the restricted opening, and thus dislodging particles toward the center exhaust area. The vertical arranged workpieces 20 as shown in FIGS. 7 and 8 are positioned radially from the center, thus they are not parallel but forming an angle. The air flow then can pass through the gaps between the workpieces. The air flow then passes through the workpieces and travels down the robot handling unit.

The clean air delivery units can also deliver uniform clean air flow through the workpieces and system after being filtered. The storage area is designed to minimize or eliminate non-uniform, turbulent, or dead space with little or no airflow with symmetric volumes, gradually changes to the airflow direction, singularly airflow directions, and controlled venting. The exhaust venting rate can also be controlled to achieve a positive internal pressure for minimizing contamination migration into the storage area.

The air flow into the storage area can be divided into several independent partial air flows through, e.g. baffles in the vicinity of the storage locations. The air flow then can be directed so that each air flow only encounter one workpiece to minimizing cross contamination. The arrangement of the air circulation system flowing clean air past the workpieces prevents the accumulation of contaminants on the workpieces which can contaminate the workpieces.

Figure 10:
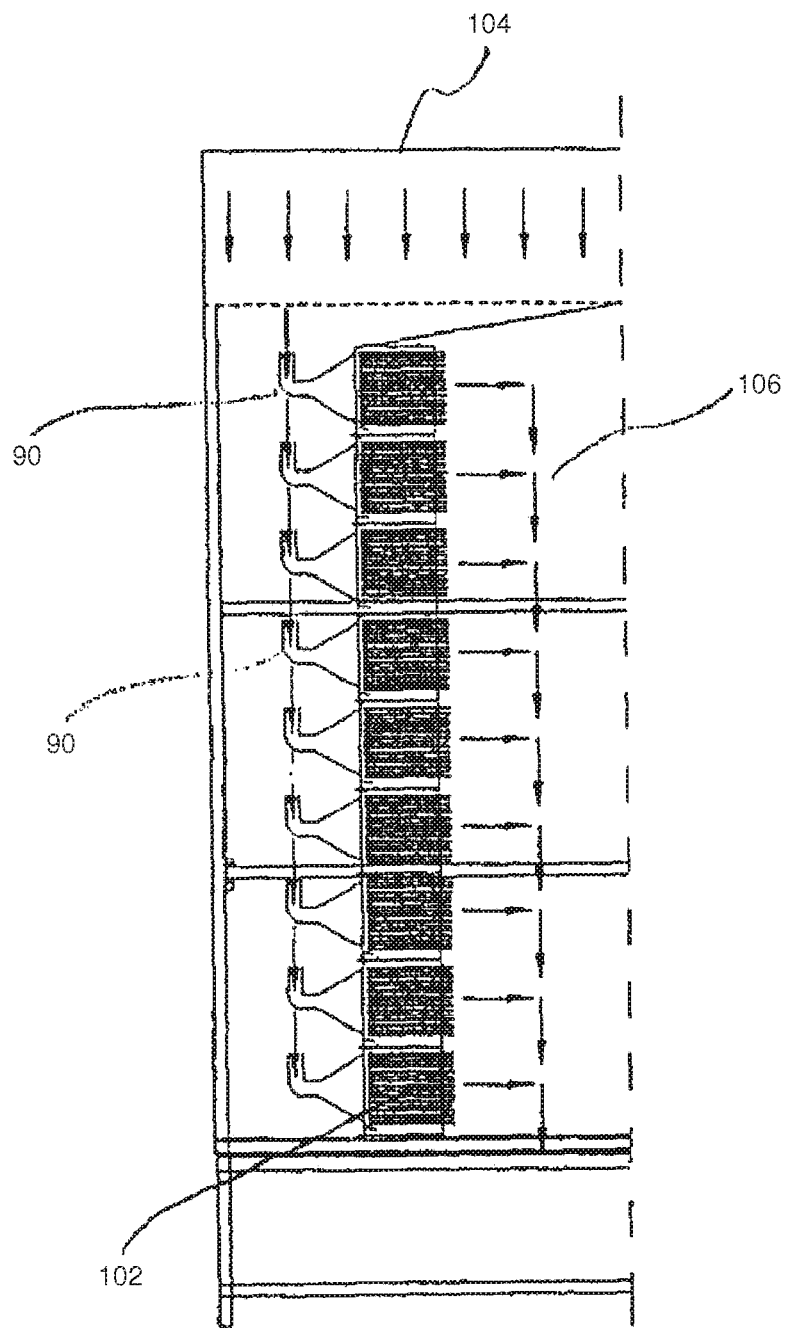
FIG. 10 shows a side view of an exemplary stocker with clean gas flow configuration.

FIGS. 9 and 10 show an exemplary arrangement of the containers 81 in the vertical direction. The handling unit 82 can achieve the different vertical levels of the containers 81 by moving along two guide rails 88 in vertical direction (perpendicular to the view level). The containers 81 in this exemplary stocker include connections 90 for flowing cleaning gas. Connections 90 are arranged at the back of the containers 81, so that the cleaning gas flushes the containers 81 from the back to the front. In addition each connection 90 can include valve 91 for selectively opened or closed. It is thus possible to flush the containers individually with cleaning gas.

FIG. 9 shows an exemplary stocker 100 having the containers 81 arranged one above the other and in a circle around a handling unit 82. In FIG. 9, the wafers 20 are stored in horizontal position in the containers 102. With horizontal storage of the wafers, the handling unit 82 does not have to turn the wafers 20 when taking in and out of the containers. The robot handling unit 82 is shown in two vertical positions, a top position numbered 82 and a bottom position numbered 82'.

FIG. 9 also shows a blower and a filter unit 104 to provide a cleaning gas, preferably filtered clean air, to the interior of the housing 12. The blower and filter unit 104 receive ambient air, which is cleaned and dried and then flown afterwards into the interior of the housing. In FIG. 10, the cleaned air is flown over connections 90 at the back of the individual containers 102. The air flow and the cleaning gas thus flow from the back of the container 102, out to the opened front and then downward 106. As discussed above, this flow provides a nozzle effect for the vertical storage, thus strengthens the cleaning efficiency. A good flow can also be achieved with the horizontal storage, as presented in these figures. Alternatively, the flow can be from the inside outward.

The stocker is a stationary stocker, provided with a robot handler, movable in the vertical direction (upward and downward) and in the rotational direction. The stocker is provided with a plural number of shelves for storing articles and positioned inward, for transferring articles between a loadlock station and the stationary stocker.

Figure 11:
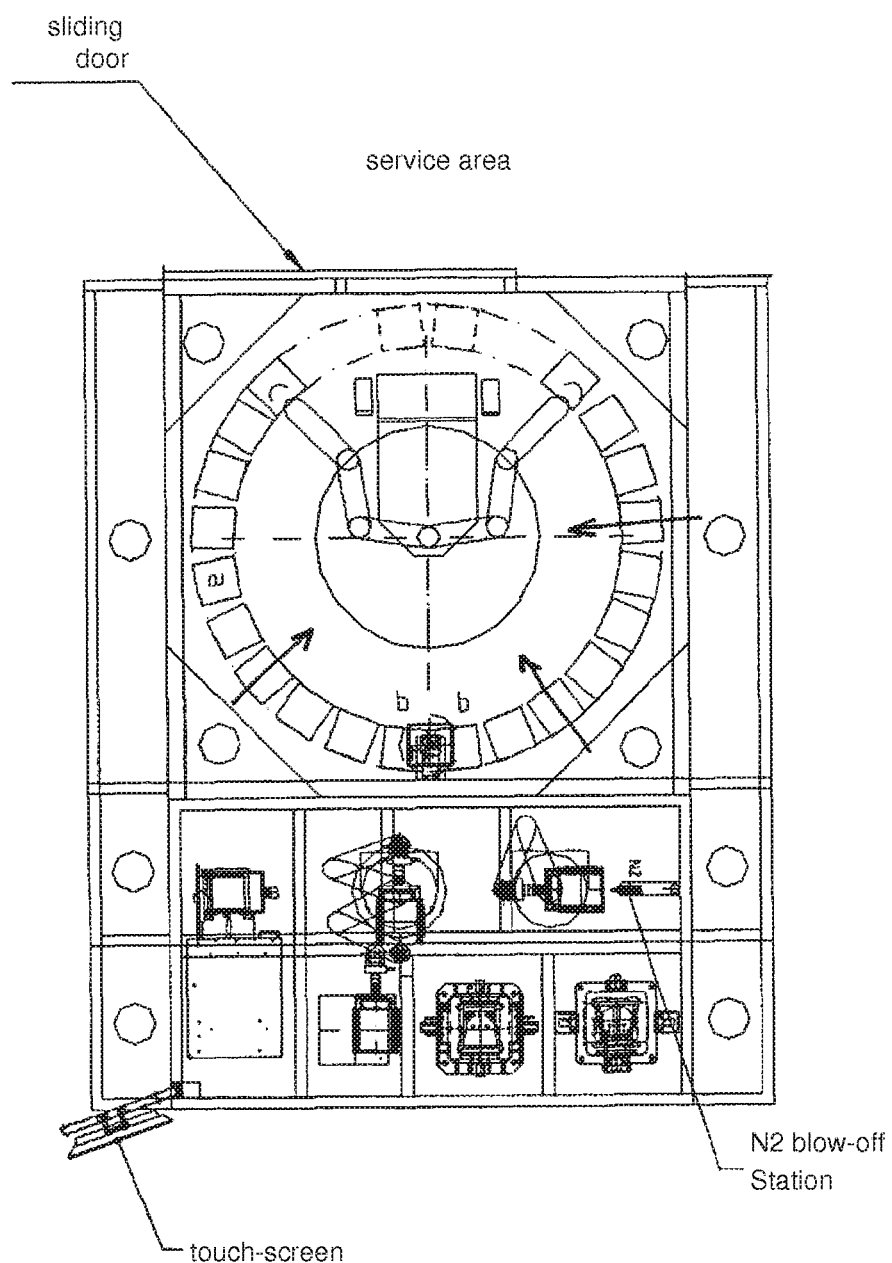
FIG. 11 shows a top view of another exemplary stocker.
Figure 13:
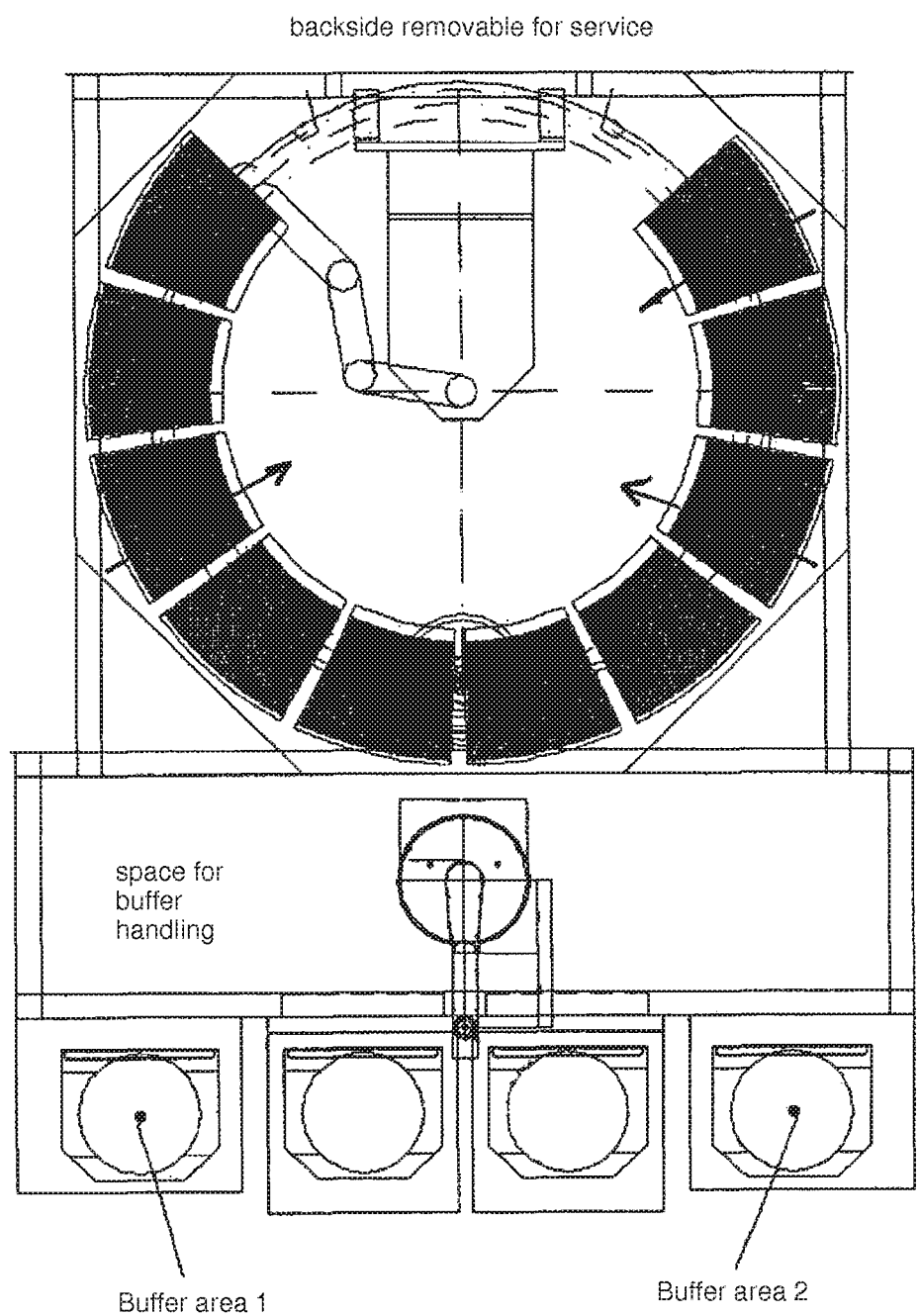
FIG. 13 shows a top view of another exemplary stocker.

FIGS. 11 and 13 show a top view of two exemplary stocker according to the present invention. The stocker shown in FIG. 11 has the workpieces arranged parallel, thus the inner gap of the workpiece compartment is smaller than the outer gap. The stocker shown in FIG. 13 has the workpieces arranged radially, thus the compartments are parallel, with the workpieces positioned closer at the inner circumference than at the outer circumference. FIG. 11 shows a circular arranged workpieces with two robot handling arms while FIG. 13 shows robot with only one handling arm. The workpiece compartments are separate at the corners where system components can be located. The stockers as shown in FIGS. 11 and 13 has clean air flow inward, from the storage wall, passing the workpieces, then to the robot handling unit, and downward to the exhaust.

A series of blowers can circulate clean air horizontally through the rack, through the slots of the racks, and over the workpieces. The blowers can be positioned in the upper or lower areas, and then air is drawn downwardly or upwardly into an enclosure before traveling horizontally into the workpieces. The air flow then exits vertically downward adjacent to the racks. Some of the air can exit near the bottom of storage area through closeable louvres and some of the air can be recirculated back.

The horizontal flow through the workpieces prevents particles from coming to rest on the workpieces and the workpiece rack, and the vertically downward air flow removes particles from the stocker storage area. The horizontal air flow is preferably flowing inward, from the outside to the center of the stocker storage area. The outside is normally the enclosure walls, thus is without any particle generation. The robot handling system is located in the center of the stocker, thus is positioned downstream of the air flow from the workpieces, and preventing particles from damaging the workpieces.

The center area of the robot handling unit can have an air delivery unit on top, and an exhaust unit in the bottom to generate a downward path for the air flow. After exiting the workpieces, the air flow merges with this downward flow and exhausts through the exhaust unit.

Figure 12:
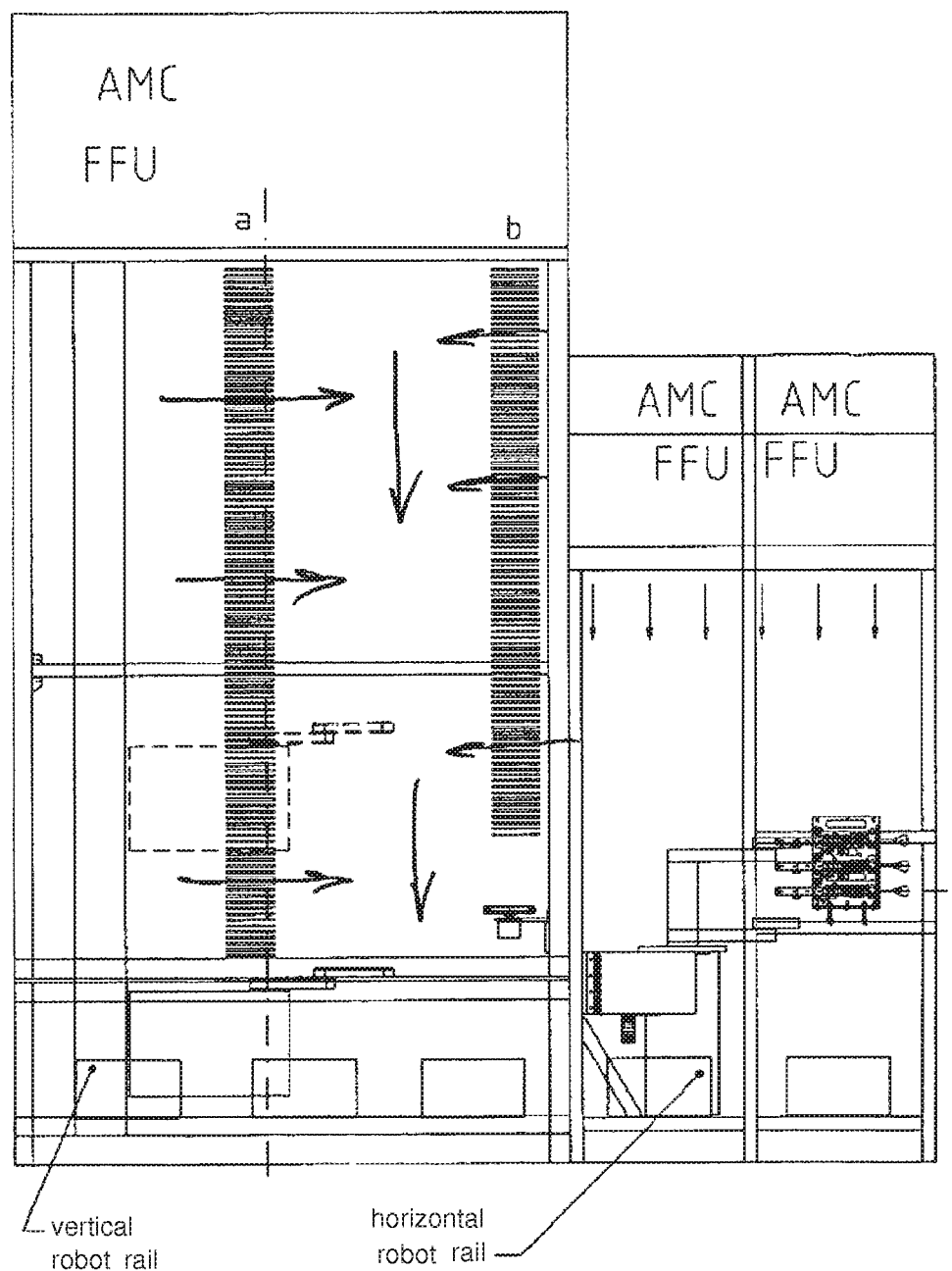
FIG. 12 shows a side view of another exemplary stocker.
Figure 14:
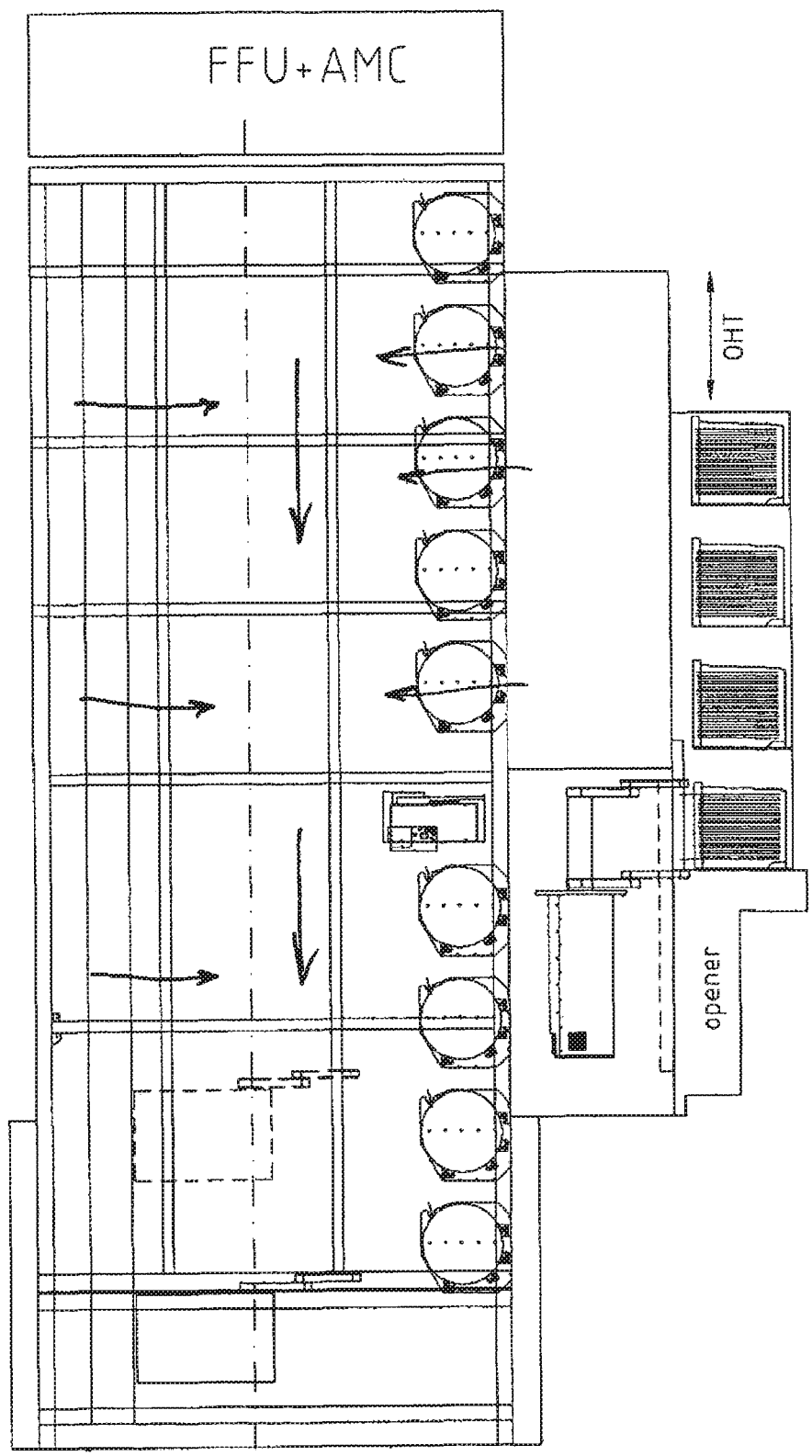
FIG. 14 shows a side view of another exemplary stocker.

FIGS. 12 and 14 show a side view of two exemplary stocker according to the present invention. The stocker in FIG. 12 has the workpieces positioned horizontally while the stocker in FIG. 14 has the workpieces positioned vertically. The robot unit is located in the middle of the workpiece compartments with a downward air flow direction, downstream of the workpieces to avoid backflow and redeposit of particles. The air flow also flows through the workpieces from the outer wall.

The clean air is filtered with the filter elements closer to the workpieces with "point of use" filters. The clean air delivery system typically includes fans (or blowers) and filter elements, or fan and filter units (FFU). The units can have adjustments or controls for both the pressure and the velocity of the generated air. The stocker includes a fan and filter unit at a top or bottom of the stocker system for filtering, circulating and re-circulating clean air through the stocker storage area to maintain the system in a clean room environment. In an exemplary, clean air from the fan filter unit is flowing down through the outer circumference of the storage area, then entering the slots between the stored workpieces to carry away any particles from the workpieces. The clean air passes by the front and back surfaces of the vertically or horizontal workpieces supported within the slots in the compartment to clean the surfaces of the workpieces. The air is then flowing down the center of the storage area.

The fan and filter unit can also provide an elevated pressure within the stocker storage area relative to the surrounding environment to ensure air flow from the stocker storage area to the robot handling assembly and then out to the surrounding environment. Thus, any particulates within the robot, for example generated upon robot movement or maintenance, will not enter into the stocker storage area.

With this flow configuration, the air flow only passes by the workpieces once. Thus any particles picked up by the air flow through a workpiece does not pass through another workpiece to prevent redeposition. The clean air from the fan and filter unit only passes though a single workpiece and then exits through a bottom of the center robot handling assembly. Moreover, with the robot handling in the center area, the particulates are most likely generated where the contacts are, such as where the robot arm contacts the workpieces, or where the workpieces contact the slots. The air flow system through the surfaces of the workpieces flows the generated particles away from, and not towards, the workpieces in the storage area.

In an alternative embodiment, a plurality of fan and filter units can be provided within the stocker so that some units deliver clean air directly to the top storage areas, some to the middle storage areas, and some to the bottom storage areas. The separation of fan and filter units minimizing possible cross contamination between the workpieces. The stocker can include baffles for directing air flow in any desired directions through the stocker storage areas.

During maintenance mode, when the enclosure is open for emergency access, the air circulation system provides flow outward to the door to prevent outside air from entering the stocker storage area. The air flow's capacity is preferably high for providing positive air pressure within the storage area with the emergency door open. The door opening area is also preferably small to enable the positive pressure, and to minimize back flow. Thus when the stocker door opens, the air flow is preferably reverse so that air flow is now flow outward, preventing outside air from entering the storage area. Center exhaust can be closed to ensure that the air flow direction is outward from the workpieces storage area.

Further, the storage area can be partitioned into a plurality of sections based on cleanliness, for example, a top section for ultra clean storage, a middle section for normal clean storage, and a bottom section for dirty storage. The flow configuration can be designed for minimizing cross contamination between these sections. The separation can be accomplished with baffles, with holed partition walls, or with air curtain configuration. The ultra clean section can be located in the bottom near the exhaust since with a high exhaust rate, there is less particulate generation.

Static reduction assembly such as ionization system can be added within the air flow for reducing the build up of static electricity to prevent charge particle attraction, and electrical static discharge. The stocker can include alarms for sensing the condition of the stocker storage area. For example, air flow sensors can sense the absence of reduced air flow to activate an alarm. Particle sensor might also activate an alarm if sensing exceeding particle limits.

The present invention discloses an article transfer and storage system, comprising a stationary stocker capable of storing a plural number of articles, surrounding a robot assembly located on the inner side of the stationary stocker.

The stock unit according to a second embodiment of the invention has a plurality of stockers and also a transfer means for transferring carriers to and from the shelves incorporated in these stockers.

What is claimed is:

1. A substrate storage chamber comprising:
   a housing including hermetically sealed side walls defining an enclosed storage area within the hermetically sealed side walls, the enclosed storage area having fixed storage stations therein, each fixed storage station defining a fixed substrate cassette configured for storing multiple bare substrates in each fixed substrate cassette, the fixed storage stations being disposed within the enclosed storage area so that an outer periphery of each storage station is disposed facing outward towards a perimeter of the hermetically sealed side walls of the housing;
   a substrate transport apparatus mounted to the housing in the enclosed storage area so that the substrate transport apparatus is located inside the outer periphery of the fixed storage stations in the enclosed storage area; and
   a blower connected to the housing and configured so as to generate a controlled gas flow ventilating the enclosed storage area and flowing through the fixed storage stations and the substrate transport apparatus, the substrate transport apparatus being downstream of the fixed storage stations;
   wherein the outer periphery of the fixed storage stations is arranged so as to controllably direct the controlled gas flow substantially uniformly from outside the outer periphery of the fixed storage stations inward substantially uniformly through the fixed storage stations.

2. The substrate storage chamber of claim 1, further comprising an exhaust configured to exhaust the gas directed inward from outside the outer periphery of the fixed storage stations.

3. The substrate storage chamber of claim 1, further comprising a filter unit to filter the controlled gas flow from the blower.

4. The substrate storage chamber of claim 1, wherein the outer periphery of the fixed storage stations and an inner periphery of the fixed storage stations are arranged such that a spacing between adjacent storage stations at the outer periphery is greater than another spacing between the adjacent storage stations at the inner periphery.

5. The substrate storage chamber of claim 1, further comprising at least one baffle disposed between adjacent substrate holding locations of each storage station.

6. The substrate storage chamber of claim 5, wherein the at least one baffle is configured to divide the controlled gas flow into several independent partial gas flows that are isolated from each other through the storage station so that each of the partial gas flows are directed by the at least one baffle around a respective substrate.

7. A workpiece stocker comprising:
   a housing including side walls defining a perimeter of the housing and an enclosed storage area within the housing;
   multiple storage containers radially disposed within the storage area such that the multiple storage containers are circumferentially spaced apart from one another to form a wedged fluid flow passage between adjacent storage containers disposed relative to the perimeter of the housing so that the wedged fluid flow passage induces radial inward flow of clean air into the wedged fluid flow passage, the wedged fluid flow passage effecting induction of the radial inward flow of clean air separate from the side walls defining the perimeter of the housing, so that clean air flowing radially inward from an outer periphery of the radially disposed multiple storage containers is accelerated through the wedged fluid flow passage by the wedged fluid flow passage separate from the side walls defining the perimeter of the housing, wherein the outer periphery of the radially disposed multiple storage containers is disposed outward towards the perimeter of the housing; and a workpiece handling apparatus mounted within a center of the radially disposed multiple storage containers downstream of the clean air flowing radially inward from an outer periphery of the radially disposed multiple storage containers.

8. The workpiece stocker of claim 7, wherein the center of the radially disposed multiple storage containers includes an exhaust configured to exhaust the air that flows radially inward from an outer periphery of the radially disposed multiple storage containers to the center.

9. The workpiece stocker of claim 7, further comprising a blower configured to provide the clean air flow from an exterior to an interior of the housing.

10. The workpiece stocker of claim 9, wherein the blower is disposed at a portion of the housing so that a direction of air flow is from the outer periphery towards the center of the radially disposed multiple storage containers.

11. The workpiece stocker of claim 9, further comprising a filter unit to filter the air from the blower.

12. The workpiece stocker of claim 7, wherein the multiple storage containers are circumferentially spaced apart such that a spacing between adjacent storage containers at an inner circumference is less than another spacing between adjacent storage containers at an outer circumference to form the wedged fluid flow passage between each adjacent storage container.

13. The workpiece stocker of claim 7, further comprising at least one baffle disposed between adjacent substrate holding locations of each storage container.

14. The workpiece stocker of claim 13, wherein the at least one baffle is configured to divide the clean air flowing radially inward from an outer periphery of the radially disposed multiple storage containers into several independent partial air flows that are isolated from each other through the storage containers so that each of the partial air flows are directed by the at least one baffle around a respective substrate.

15. A method comprising:
providing a housing of a workpiece stocker including side walls, the side walls defining a perimeter of the housing and an enclosed storage area within the housing;
providing multiple storage containers disposed within the storage area,
radially positioning the multiple storage containers, circumferentially spaced apart from one another to form a wedged fluid flow passage between adjacent storage containers disposed relative to the perimeter of the housing so that the wedged fluid flow passage induces radial inward flow of clean air into the wedged fluid flow passage, the wedged fluid flow passage effecting induction of the radial inward flow of clean air separate from the side walls defining the perimeter of the housing, so that clean air flowing from an outer periphery to a center of the radially positioned multiple storage containers is accelerated through the wedged fluid flow passage by the wedged fluid flow passage separate from the side walls defining the perimeter of the housing toward the center, where an outer periphery of the radially positioned multiple storage containers is disposed outward towards the perimeter of the housing; and
providing a workpiece handling apparatus mounted within a center of the radially positioned multiple storage containers downstream of the clean air flowing from an outer periphery to a center of the radially positioned multiple storage containers.

16. The method of claim 15, further comprising exhausting, with an exhaust in the center of the radially positioned multiple storage containers, the air that flows radially inward from an outer periphery to the center.

17. The method of claim 15, further comprising blowing, with a blower, air flow from an exterior to an interior of the housing.

18. The method of claim 17, further comprising filtering, with a filter unit, the air from the blower.

19. The method of claim 15, wherein the multiple storage containers are circumferentially spaced apart such that a spacing between adjacent storage containers at an inner circumference is less than another spacing between adjacent storage containers at an outer circumference to form the wedged fluid flow passage between each adjacent storage container.

20. The method of claim 15, further comprising dividing, with at least one baffle, the clean air flowing radially inward from an outer periphery of the radially disposed multiple storage containers into several independent partial air flows that are isolated from each other through the storage containers so that each of the partial air flows are directed by the at least one baffle around a respective substrate.

* * * * *